United States Patent [19]

Mayweather, III

[11] Patent Number: 4,782,389

[45] Date of Patent: Nov. 1, 1988

[54] ADAPTIVE M-TILE SAMPLE PRODUCER

[75] Inventor: William T. Mayweather, III, Stone Mt., Ga.

[73] Assignee: RCA Licensing Corporation, Princeton, N.J.

[21] Appl. No.: 44,375

[22] Filed: Apr. 30, 1987

[51] Int. Cl.[4] .......................... H04N 5/21; H04N 5/14
[52] U.S. Cl. ..................................... 358/167; 358/166; 382/54; 455/307
[58] Field of Search .................. 358/166, 167, 36, 37, 358/21 R, 160, 163; 455/307, 296; 375/25; 382/54, 27

[56] References Cited

U.S. PATENT DOCUMENTS

| | | | |
|---|---|---|---|
| 4,334,244 | 6/1982 | Chan et al. | 358/166 |
| 4,400,729 | 8/1983 | Jones | 358/166 |
| 4,464,788 | 8/1984 | Sternberg et al. | 382/41 |
| 4,485,399 | 11/1984 | Schulz et al. | 358/167 |
| 4,541,116 | 9/1985 | Lougheed | 382/54 |
| 4,672,463 | 6/1987 | Tomohisi et al. | 382/54 |
| 4,682,230 | 7/1987 | Perlman et al. | 350/167 |

OTHER PUBLICATIONS

D. R. K. Brownrigg, "The Weighted Median Filter", Communications of the ACM, vol. 27, No. 8, Aug. 84, pp. 807–818.

P. M. Narendra, "A Separable Median Filter for Image Noise Smoothing", 1978, IEEE, CH1318-5/78/00-00-0137.

R. G. Harber, et al., "VLSI Implementation of a Fast Rank Order Filtering Algorithm", Proceedings ICASSP 85, Florida, vol. 3 of 4, PB1396-1399.

N. Demassieux, et al., "VLSI Architecture for One Chip Video Median Filter", Proceedings of ICASSP 85, pp. 1001–1004.

*Primary Examiner*—James J. Groody
*Assistant Examiner*—John K. Peng
*Attorney, Agent, or Firm*—Eugene M. Whitacre; Paul J. Rasmussen; Eric P. Herrmann

[57] ABSTRACT

Apparatus is disclosed for adaptively producing a sample having a desired M-tile value, and includes a source of a set of input samples and a source of a control signal. Means are provided for adaptively masking or replacing a subset of the input samples with samples having a predetermined value in response to the control signal. A sorter receives the resulting masked samples and produces an ordered set of samples in rank order. Sample selecting means coupled to the output of the sorter provides an output sample from the location in the ordered set of samples corresponding to the desired M-tile, in response to the control signal.

12 Claims, 4 Drawing Sheets

FIG. 2a.

| IMAGE DATA | | | INPUT | MASK | | | MASKED | SORTED | |
|---|---|---|---|---|---|---|---|---|---|
| 3 | 1 | 4 | 5 | x | x | x | 5 | 9 | |
| 1 | 5 | 9 | 6 | x | * | x | 6 | 6 | |
| 2 | 6 | 5 | 2 | x | x | x | 2 | 5 | |
| | | | 9 | | | | 9 | 5 | MEDIAN |
| | | | 5 | | | | 5 | 4 | → 4 |
| | | | 1 | | | | 1 | 3 | |
| | | | 4 | | | | 4 | 2 | |
| | | | 1 | | | | 1 | 1 | |
| | | | 3 | | | | 3 | 1 | |

FIG. 2b.

| IMAGE DATA | | | INPUT | MASK | | | MASKED | SORTED | |
|---|---|---|---|---|---|---|---|---|---|
| 3 | 1 | 4 | 5 | x | | x | 5 | 5 | |
| 1 | 5 | 9 | 6 | | * | | 0 | 5 | MEDIAN |
| 2 | 6 | 5 | 2 | x | | x | 2 | 4 | → 4 |
| | | | 9 | | | | 0 | 3 | |
| | | | 5 | | | | 5 | 2 | |
| | | | 1 | | | | 0 | 0 | |
| | | | 4 | | | | 4 | 0 | DISREGARD |
| | | | 1 | | | | 0 | 0 | |
| | | | 3 | | | | 3 | 0 | |

ADAPTIVE M-TILE SAMPLE PRODUCER

This invention relates to an adaptive M-tile sample producer in which an M-tile of an adaptively determined subset of input samples is produced.

Present digital technology has made possible more advanced processing of signals. For example, matrices of samples, representing images, may now be processed by computer yielding enhanced images. As another example, video signals representing images may be digitally processed yielding similarly enhanced images. One form of such image enhancing digital processing is called median filtering.

An example of a median filter involves a window of picture elements (pixels) each representing a particular point in the image. The window includes a given pixel and a plurality of pixels surrounding the given pixel. One example of such a window is a 3×3 matrix of pixels. (Configurations other than square matrices may also be used, for example, a cross configuration consisting of the given sample and the four samples directly above, below, to the right of, and to the left of, the given sample.) The matrix includes a given pixel occupying the center square and eight other pixels surrounding the given pixel. The image is enhanced by replacing the given pixel with a pixel having the value of the median of the nine pixels in the window. It has been found that a median filter will eliminate impulse-type noise, which manifests itself as "salt and pepper" noise in the displayed image without, however, softening edges or rounding corners of objects in the image.

The median of a set of samples is a specific example of an M-tile of the set of samples. An M-tile value is the value of a sample which occupies a particular location in a list of the input samples sorted according to their values. For example, the M-tile value called the median is the value of the sample which is in the middle of the sorted list. As other examples, the M-tile value called the upper quartile is the value of the sample located $\frac{1}{4}$ of the way from the highest valued to the lowest valued sample in the sorted list; and the M-tile value called the lower quartile is the value of the sample located $\frac{3}{4}$ of the way from the highest valued to the lowest valued sample in the sorted list.

FIG. 1 illustrates, in the column labeled INPUT, a set of samples represented by a column of squares. The number within each square represents the value of that sample. The column of squares labeled SORTED, represents the set of samples from the column labeled INPUT rearranged in rank order with the highest valued sample at the top and the owest valued sample at the bottom. The three selected M-tiles described above (i.e. the upper quartile, median and lower quartile) are illustrated as being obtained from their appropriate locations in the ordered list. For example, the median valued sample (having the value 4) is the sample at the middle of the sorted list, (i.e. it has five samples above it and five samples below it). The upper quartile sample (having the value 5) is the sample $\frac{1}{4}$ of the way from the top to the bottom of the sorted list, (i.e. it has two samples above it and eight samples below it). The lower quartile valued sample (having the value 2) is the sample $\frac{3}{4}$ of the way from the top to the bottom of the sorted list, (i.e. it has eight samples above it and two samples below it).

When processing image data, it may become desirable to determine the M-tile value (e.g. the median) of only a subset of the set of input samples. For example, in the presence of high density impulse noise, it may be desirable to use all of the input samples to maximize the suppression of the impulse noise. However, in the presence of low density impulse noise, it may be desirable to use fewer of the input samples in order to minimize the effect of filtering on the underlying image.

The present invention is directed toward an adaptive M-tile sample producer comprising a source of a set of input samples and a source of a control signal. Means are provided for adaptively replacing a subset of the set of input samples with samples having predetermined value in response to the control signal. Means are provided which receive the resulting samples and produce an ordered set of samples in rank order. Means are provided for producing an output sample from the location in the ordered set of samples corresponding to the desired M-tile in response to the control signal.

In the drawings:

FIGS. 2a and 2b are diagrams useful in understanding a method of adaptively median filtering a set of input samples;

Figure 1:
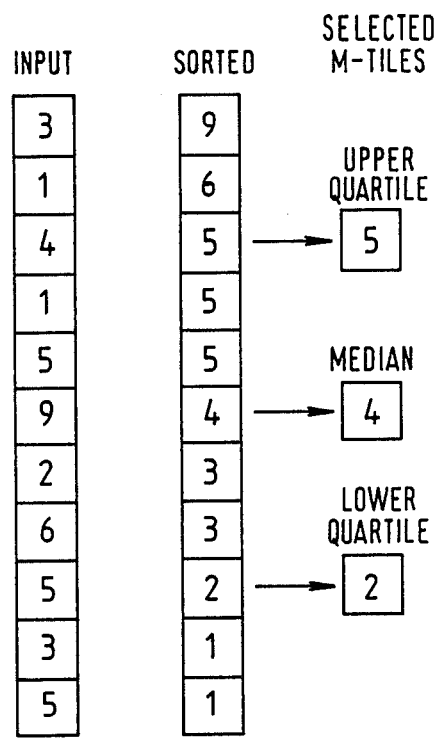
FIG. 1 is a diagram useful in understanding the meaning of the term M-tile, in particular for the M-tiles: upper quartile, median and lower quartile.

In the detailed description below, the desired M-tile is assumed to be the median. However, any M-tile could be derived by apparatus according to the present invention.

One method of median filtering image data entails the use of a window, which in this case is a 3×3 matrix of pixels, although as described above, other window configurations than a 3×3 matrix may be used. As described above, the given pixel, i.e. the pixel being filtered, is the center pixel in the matrix of pixels and the set of samples used to derive the median are all of the nine samples in the matrix. The window (comprising the 3×3 matrix) may be envisioned as moving over the image pixel-by-pixel so that each pixel of the image, in turn, is filtered by being the middle sample in the matrix. A filtered image is produced consisting of the median valued pixels located at the locations corresponding to that of each given pixel, as the window moved over the image.

In FIGS. 2a and 2b, such a window is represented as a 3×3 matrix labeled IMAGE DATA and containing nine squares. Each square represents a pixel. The number within each square represents the value of that pixel. A column of nine squares labeled INPUT represents samples which have a one-to-one correspondence in value to the pixels within the IMAGE DATA matarix. The pixels from the IMAGE DATA matrix taken from left to right and top to bottom corresponds to the samples in the column labeled INPUT taken from bottom to top. A 3×3 matrix labeled MASK illustrates which pixels in the IMAGE DATA window are used when deriving the median value. The asterisk in the middle square indicates that the given sample is used. Small "x"s in remaining squares indicate that the pixels at the corresponding locations of the IMAGE DATA window are also used. If a box is empty, the corresponding pixel is in a subset of pixels not used when deriving the median value.

In FIG. 2a, there are "x"s in all of the squares surrounding the middle square, indicating that all of the input samples are used to derive the median value. In the column of samples labeled MASKED, therefore, all of the samples from the column labeled INPUT are present and unaltered. The column labeled SORTED is an ordered set consisting of the samples from the column labeled MASKED with the highest valued sample at the top and the lowest valued sample at the bottom. In this case, there are nine samples used to derive the median value. The sample at the fifth location, (in this example having the value 4) contains the median value. The sample labeled MEDIAN, and containing the value 4 is obtained from this middle location in the ordered list of samples.

In FIG. 2b, a subset of the input samples is not used when deriving the median value. The window labeled IMAGE DATA and the column of samples labeled INPUT are the same as those for FIG. 2a. The matrix labeled MASK includes an asterisk in the center square, indicating that the given sample is used when deriving the median. In addition, there are "x"s in the corner squares. This indicates that the samples in the corresponding locations of the IMAGE DATA window are used when deriving the median. The remaining squares having no "x"s in them, is meant to indicate that the samples at corresponding locations of the IMAGE DATA window are in the subset of samples not used when determining the median. This subset of samples has been replaced, in the column of samples labeled MASKED, with samples having a predetermined value of "0". When this column of samples is sorted, the four "0"s are at the bottom of the SORTED column and the five samples from which the median is to be determined, are in the top five locations. The location containing the median-valued sample is at the middle of these five samples or at the third location from the top. The remaining four samples at the bottom of the column are disregarded.

In general, a mask indicating that a subset of samples is replaced with the predetermined value of "0", results in those values being at the bottom of the SORTED column and the median value being in the middle of the ordered list of the remaining samples. For example, a mask including only the three samples in the middle column or only the three samples in the middle row may also be advantageously used. In such a case, the three values used to determine the median will occupy the top three locations in the SORTED column and "0"s will occupy the bottom six locations. The median will then be the value of the sample in the second location from the top, i.e. the middle location of the top three locations in the SORTED column.

Figure 3:
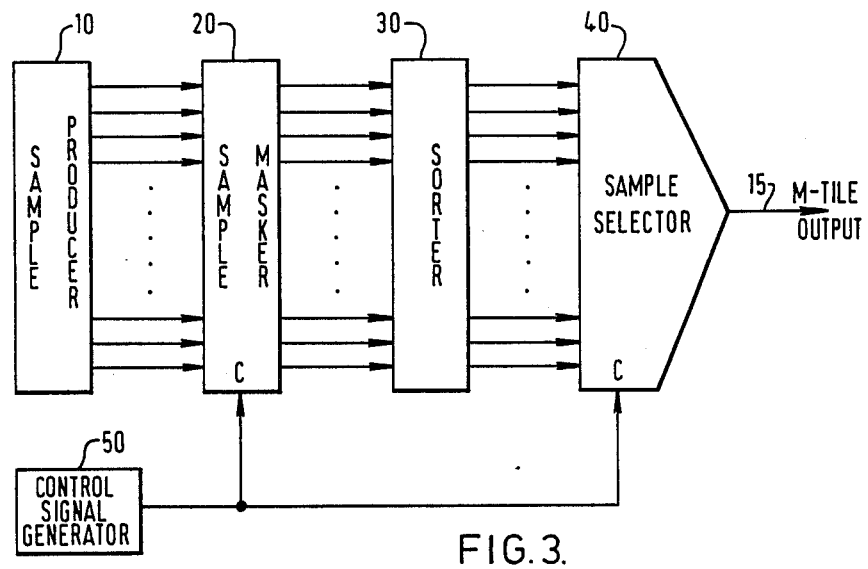
FIG. 3 is a block diagram of an adaptive M-tile sample producer embodying the present invention.

FIG. 3 illustrates an M-tile valued sample producing apparatus. In FIG. 3, a sample producer 10 produces a set of input samples at a plurality of output terminals. The set of samples represent samples from a window. The plurality of output terminals of sample producer 10 are coupled to corresponding input terminals of a masked sample producer 20. Masked sample producer 20 produces a set of masked samples at a plurality of output terminals, in response to a control signal at a control input terminal C. The plurality of output terminals of the masked sample producer 20 are coupled to corresponding input terminals of a sorter 30. Sorter 30 produces an ordered set of samples at a plurality of output terminals. The plurality of output terminals of sorter 30 are coupled to corresponding input terminals of a sample selector 40. Sample selector 40 produces the sample from the location in the ordered set of samples containing the desired M-tile at an output terminal 15, in response to the control signal at a control input terminal C. A control signal generator 50 has an output terminal coupled to the respective control input terminals C of masked sample producer 20 and sample selector 40.

In operation, sample producer 10 produces at its output terminals a set of samples, representing a window of pixels for example, from an image representative signal. These samples may be envisioned as corresponding to the columns of samples labeled INPUT in FIGS. 2a and 2b. Sample masker 20 takes as input, the input samples from sample producer 10 and replaces a subset of those samples with "0" valued samples in response to the value of the control signal. The output of masked sample producer 20 may be envisioned as corresponding to the columns of samples labeled MASKED in FIGS. 2a and 2b. The control signal from control signal generator 50, supplied to masked sample producer 20 adaptively controls which mask configuration is used to select the subset of samples to be replaced by "0" valued samples.

Figure 4:
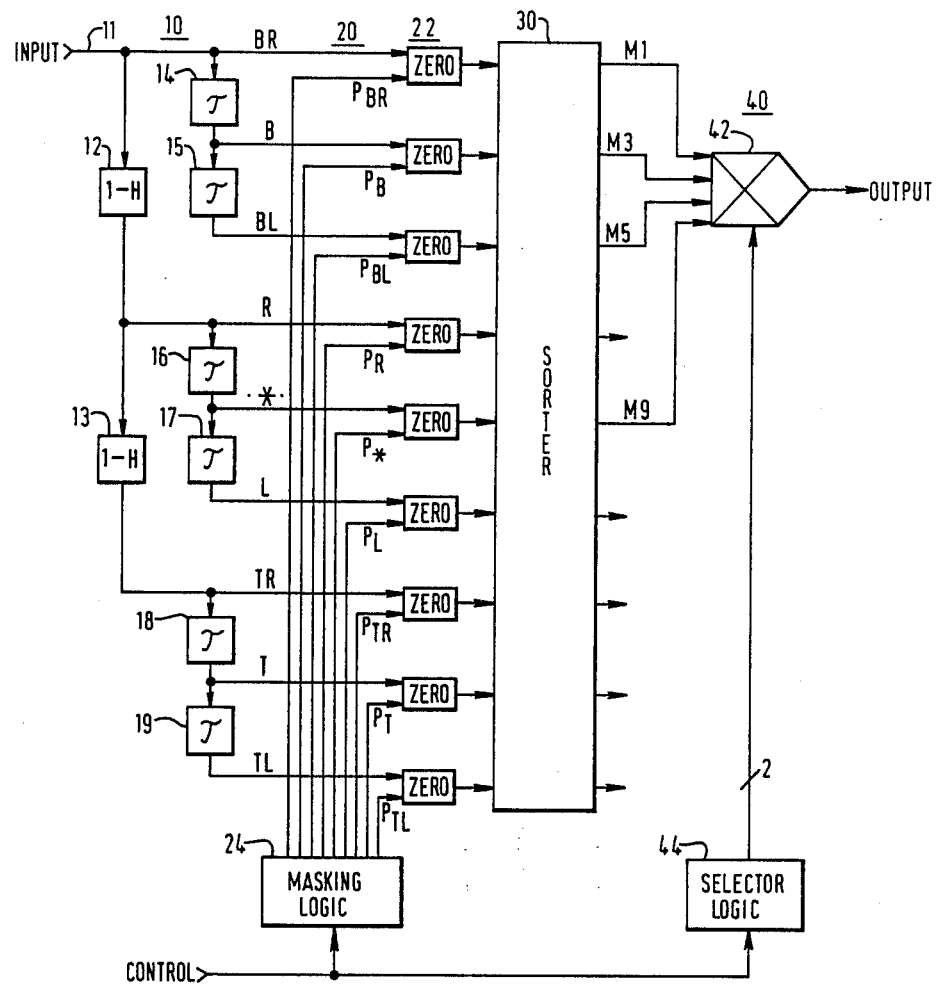
FIG. 4 is a block diagram of an adaptive M-tile sample producer which may be used for processing a video signal.

Sorter 30 receives the masked samples from masked sample producer 20 and produces an ordered set of those samples at its output terminals. In the paper, "VLSI Architecture For A One Chip Video Median Filter" published in Proceedings of the ICASSP 85, pp. 1001–1004 by Demassieux et al. FIGS. 3 and 4 illustrate a systolic sorting array which may be used to implement the signal sorter 30 of FIG. 3. The output of signal sorter 30 may be envisioned as the column of samples labeled SORTED in FIGS. 2a and 2b. The uppermost output terminal from sorter 30 of FIG. 3 carries the highest valued sample, the bottommost output terminal carries the lowest valued sample, and the intervening output terminals carry the remaining samples in rank order. Sample selector 40 receives the sorted samples from sorter 30 at its input terminals and couples the input terminal corresponding to the location containing the desired M-tile to its output terminal.

Referring again to FIG. 2, if the mask, for example, allows for nine input samples, then sample selector 40 couples the sample from the middle output terminal of sorter 30 to the output terminal 15. If the mask allows the passage of five input samples, then sample selector 40 couples the sample at the third output terminal from the top (the middle terminal of the five upper terminals) of sorter 30 to the output terminal 15. The output terminal of sorter 30 that is coupled to the output terminal 15 depends upon the number of samples used to derive the desired M-tile. The control signal from control signal generator 50 supplied to the control input terminal C of sample selector 40 controls which input terminal of sample selector 40 is coupled to its output terminal. Sample selector 40 may, for example, be a multiplexer.

FIG. 4 illustrates a more detailed embodiment of the M-tile sample producer illustrated in FIG. 3, adapted for processing a television video signal. In FIG. 4, an input terminal 11 is coupled to a source (not shown) of at least a component of a television video signal (e.g. a luminance or chrominance signal). Input terminal 11 is coupled to an input terminal of horizontal line interval delay element 12 and a pixel interval delay element 14. An output terminal of pixel interval delay element 14 is coupled to an input terminal of pixel interval delay element 15.

An output terminal of horizontal line interval delay element 12 is coupled to an input terminal of a second horizontal line interval delay element 13 and an input terminal of a pixel interval delay element 16. An output terminal of pixel interval delay element 16 is coupled to an input terminal of pixel interval delay element 17. An output terminal of horizontal line interval delay element 13 is coupled to an input terminal of a pixel interval delay element 18. An output terminal of pixel interval delay element 18 is coupled to an input terminal of a pixel interval delay element 19. Delay elements 12 through 19, in combination, form a sample producer 10, as illustrated in FIG. 3.

Input terminal 11 and the output terminals of delay elements 12 through 19 are coupled to data input terminals of respective zeroing circuits 22. Output terminals of the respective zeroing circuits 22 are coupled to respective input terminals of a sorter network 30. Selected output terminals of sorter 30, representing the locations of samples having the median value for different numbers of input samples, are supplied to respective input terminals of a multiplexer 42. An output terminal of multiplexer 42 produces median valued output samples.

A control input terminal is coupled to a source (not shown) of a control signal. This source may, for example, be an impulse noise density estimator. The control input terminal is coupled to an input terminal of masking logic circuitry 24. Respective output terminals of masking logic circuitry 24 are coupled to enable input terminals of the zeroing circuits 22. The control input terminal is also coupled to an input terminal of selector logic 44. A 2-bit output terminal (designated by the slash through the signal path with the numeral 2 near it) of selector logic 44 is coupled to a control input terminal of multiplexer 42.

In operation, delay circuits 12 through 19 produce samples at their output terminals representing a $3\times3$ pixel window of the image represented by the input television signal. From top to bottom, these output terminals produce samples representing the bottom right (BR), the bottom (B), the bottom left (BL), the righthand (R), the center (or given) (*), the lefthand (L), the top right (TR), the top (T) and the top left (TL) squares in the $3\times3$ pixel matrix.

Masking logic 24 generates pixel enable signals $P_{BR}$, $P_B$, $P_{BL}$, $P_R$, $P_*$, $P_L$, $P_{TR}$ $P_T$ and $P_{TL}$ which are logic "1" signals when corresponding pixels are used to derive the median valued sample, and a logic "0" signal when the corresponding pixel is in the subset of samples not used. Zeroing circuits 22 each either passes the sample at its data input terminal to its output terminal when the signal at its enable input terminal is a logic "1" signal or substitutes a sample having the value "0" when the signal at its enable input terminal is a logic "0" signal. An example of such a zeroing circuit is described in detail below.

If, for example, the mask of FIG. 2a is selected, indicating that all nine samples are to be used to derive the median valued sample, then all of the pixel enable signals $P_{BR}$ through $P_{TL}$ are logic "1" signals. In this case, the sample at the middle output terminal of sorter 30 (labeled M9) produces the median valued sample. Multiplexer 42 is conditioned by the signal from selector logic 44 to couple signal M9 to the output terminal, under these circumstances.

If the mask illustrated in FIG. 2b is selected, indicating that five samples are used to derive the median valued sample, then the pixel enable signals for the top left ($P_{TL}$), the top right ($P_{TR}$), the center or given ($P_*$), bottom left ($P_{BL}$) the bottom right pixels ($P_{BR}$) are all logic "1" signals. The remaining pixel enable signals, i.e. for the top ($P_T$), the left hand ($P_L$), the right hand ($P_R$) and the bottom pixels ($P_B$) are all logic "0" signals. In this case, the output terminal labeled M5 of sorter 30, provides the sample having the median value of the five selected input samples. Multiplexer 42 is conditioned by selector logic 44 to couple signal M5 to its output terminal.

If a mask consisting of three input pixels is desired, then the three pixel enable signals corresponding to the desired three input samples are made logic "1" signals, and the remaining pixel enable signals are made logic "0" signals. Multiplexer 42 is configured to couple output terminal M3 of sorter 30 to its output terminal. In addition, if it is desired to turn off filtering altogether, then a mask is generated including only the center pixel (*) by generating a pixel enable signal ($P_*$), for the center pixel of a logic "1" signal and all of the remaining eight pixel enable signals of logic "0" signals. Multiplexer 42 is enabled to couple output terminal M1 of sorter 30 to its output terminal.

Masking logic 24 and selector logic 44 may include, for example, combinatorial logic for decoding the control signal into the pixel enable signals ($P_{BR}$-$P_{TL}$), and multiplexer 42 control signal respectively. Alternatively, masking logic 24 and selector logic 44 may include a read only memory (ROM), to perform the decoding. Such ROMS would have address input terminals coupled to the control input terminal and data output terminals coupled to zeroing circuits 22 or multiplexer 42 respectively. Each location of the ROMS, corresponding to the address represented by the control signal, is preprogrammed with the appropriate data to correctly control the zeroing circuits 22 and multiplexer 42.

Figure 5:
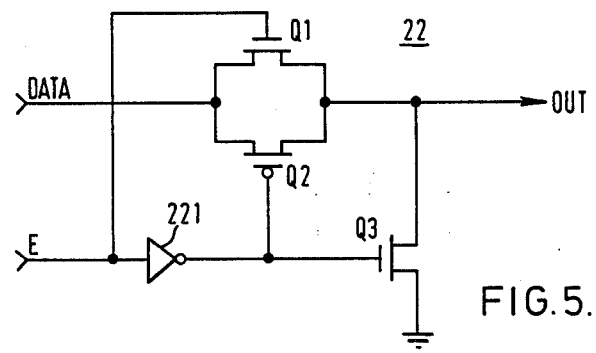
FIG. 5 is a schematic diagram of a zeroing circuit which may be used in the M-tile sample producer illustrated in FIG. 4.

FIG. 5 illustrates a schematic diagram of a bit slice of a zeroing circuit 22 which may be used in the median filter illustrated in FIG. 4. One circuit, as illustrated in FIG. 5, is required for each bit of the multibit digital signal processed by the zeroing circuit. The enable input terminals of each bit slice are coupled together, and receive the corresponding pixel enable signal. The data input terminals receive mutually different data input bit signals.

In FIG. 5, a data input terminal (DATA) is coupled to an input terminal of a switch circuit consisting of the parallel connection of source-drain paths of complementary MOS transistors Q1 and Q2. An output terminal of the switch circuit is coupled to an output terminal (OUT). The output terminal (OUT) is also coupled to a logic zero potential through a source-drain path of a third MOS transistor Q3. An enable input terminal (E) is coupled to a gate electrode of MOS transistor Q1 and an input terminal of an inverter 221. An output terminal of inverter 221 is coupled to gate electrodes of MOS transistors Q2 and Q3.

In operation, when the signal at the enable input terminal (E) is a logic "1" signal, transistor Q1 is conditioned to be in its conductive state. The output of inverter 221 is a logic "0" signal conditioning MOS transistor Q2 to its conductive state and conditioning MOS transistor Q3 to its nonconductive state. In this case, the signal at the input terminal (IN) is coupled through the switch to the output terminal (OUT).

If the signal at enable input terminal (E) is a logic "0" signal, then MOS transistor Q1 is conditioned to be nonconductive. The output of inverter 221 is a logic "1" signal, conditioning MOS transistor Q2 to be nonconducting and conditioning MOS transistor Q3 to be conducting. In this case, the output terminal (OUT) is isolated from the input terminal (IN) and instead, is coupled to a logic zero potential, e.g. ground potential.

Although described primarily with respect to digital sampled data systems, a median filter, as described above, may be arranged to process sampled data analog or continuous analog signals.

What is claimed is:

1. An adaptive M-tile sample producer, comprising:
   a source of a set of input samples;
   a source of a control signal;
   means, coupled to said sample source for producing a set of masked samples consisting of said set of input samples wherein a subset of said input samples, selected in response to said control signal, are replaced with samples having a predetermined value;
   means, coupled to said masked sample producer, for producing an ordered set of samples consisting of said set of masked samples in rank order;
   means, coupled to said ordered sample producer, for producing the one of said ordered set of samples having the value corresponding to a desired M-tile of said input samples to an output terminal in response to said control signal.

2. The sample producer of claim 1, wherein said sample source comprises:
   a source of television video signal; and
   a tapped delay line coupled to said video signal source.

3. The sample producer of claim 2, wherein said video signal source supplies at least one component of a composite color television video signal.

4. The sample producer of claim 2, wherein said tapped delay line produces a plurality of signals representing the respective values of an image at a given location and at a plurality of locations surrounding said given location.

5. The sample producer of claim 4, wherein said tapped delay line produces nine signals representing image locations disposed in a three by three matrix where said given location is the middle location of said matrix.

6. The sample producer of claim 1, wherein said masked sample producer replaces said subset of input samples with zero-valued samples.

7. The sample producer of claim 6, wherein said masked sample producer comprises a plurality of zeroing circuits corresponding to respective input samples.

8. The sample producer of claim 7, wherein at least one of said plurality of zeroing circuits includes a controlle switch comprising:
   a data input terminal;
   an output terminal;
   an enable input terminal;
   a source of a zero-valued sample; and
   means for selectively coupling said input terminal or said source of a zero-valued sample to said output terminal in response to said signal at said enable input terminal.

9. The sample producer of claim 8, wherein:
   said input sample is an n-bit digital sample; and
   at least one of said zeroing circuits comprises a plurality of n controlled switches.

10. The sample producer of claim 9, wherein at least one of said controlled switches comprises:
    a first MOS transistor of a first conductivity type having a source-drain path coupled between said input and said output terminals, and a gate electrode coupled to said enable input terminal;
    a second MOS transistor of a second conductivity type having a source-drain path coupled between said input and said output terminals, and a gate electrode;
    a third MOS transistor of said first conductivity type, having a source-drain path coupled between said output terminal and a source of reference potential, and a gate electrode; and
    an inverter coupled between said enable input terminal and said gate electrodes of both said second and said third MOS transistors.

11. The sample producer of claim 1 wherein said means for producing an ordered set of samples comprises a systolic sorting array.

12. The sample producer of claim 1 wherein said means for producing an ordered set of samples has a plurality of output terminals at which respective ones of said ordered set are available and wherein said M-tile sample producer comprises a multiplexer having a plurality of input connections respectively coupled to said plurality of output terminals of said means for producing an ordered set of samples, said multiplexer having an output terminal for producing said M-tile sample.

* * * * *